United States Patent [19]

Jones et al.

[11] Patent Number: 4,973,899
[45] Date of Patent: Nov. 27, 1990

[54] CURRENT SENSOR AND METHOD UTILIZING MULTIPLE LAYERS OF THIN FILM MAGNETO-OPTIC MATERIAL AND SIGNAL PROCESSING TO MAKE THE OUTPUT INDEPENDENT OF SYSTEM LOSSES

[75] Inventors: Stephen R. Jones; Terrill G. Power, both of Rockford, Ill.

[73] Assignee: Sundstrand Corporation, Rockford, Ill.

[21] Appl. No.: 397,865

[22] Filed: Aug. 24, 1989

[51] Int. Cl.$^5$ .................. G01R 31/00; G01B 11/00
[52] U.S. Cl. .................. 324/96; 324/117 R; 324/244; 250/225; 356/368
[58] Field of Search ............ 324/96, 244, 117 R; 356/374, 375, 376, 377, 378, 368; 250/231 R, 225

[56] References Cited

U.S. PATENT DOCUMENTS

| | | | |
|---|---|---|---|
| H 371 | 11/1987 | Bobb | 324/96 |
| 3,324,393 | 6/1967 | Cassey et al. | 324/96 |
| 3,419,802 | 12/1968 | Pelenc et al. | 324/96 |
| 3,502,978 | 3/1970 | Bernard et al. | 324/96 |
| 3,581,202 | 5/1971 | Pelenc et al. | 324/96 |
| 3,590,374 | 6/1971 | Evans et al. | 324/96 |
| 3,597,683 | 8/1971 | Saito et al. | 324/96 |
| 3,605,013 | 9/1971 | Yoshikawa et al. | 324/96 |
| 3,693,082 | 9/1972 | Jaecklin | 324/96 |
| 3,708,747 | 1/1973 | Lesueur | 324/96 |
| 3,746,983 | 7/1973 | Renz | 324/96 |
| 3,978,334 | 8/1976 | McCardell | 250/225 |
| 3,980,949 | 9/1976 | Feldtkeller | 324/96 |
| 4,070,620 | 1/1978 | Feldtkeller | 324/96 |
| 4,070,622 | 1/1978 | Harms et al. | 324/96 |
| 4,112,367 | 9/1978 | Hepner et al. | 324/244 |
| 4,232,264 | 11/1980 | Papp et al. | 324/96 |
| 4,243,936 | 1/1981 | Papp et al. | 324/96 |
| 4,255,018 | 3/1981 | Ulrich et al. | 350/375 |
| 4,348,587 | 9/1982 | Tangonan et al. | 250/227 |
| 4,363,061 | 12/1982 | Vaerewyck et al. | 361/31 |
| 4,370,612 | 1/1983 | Puech et al. | 324/117 R |
| 4,428,017 | 1/1984 | Vaerewyck et al. | 361/31 |
| 4,516,073 | 5/1985 | Doriath et al. | 324/244 |
| 4,529,875 | 7/1985 | Brogardh et al. | 250/227 |
| 4,531,092 | 7/1985 | Shibano | 324/244 |
| 4,539,519 | 9/1985 | Ulrich et al. | 324/117 R |
| 4,539,521 | 9/1985 | Matsumoto | 324/244 |
| 4,540,937 | 9/1985 | Asars | 324/96 |
| 4,563,639 | 1/1986 | Langeac | 324/96 |
| 4,563,646 | 1/1986 | Desormiere | 324/244 |
| 4,564,754 | 1/1986 | Sato et al. | 324/225 |
| 4,578,639 | 3/1986 | Miller | 324/96 |
| 4,581,579 | 4/1986 | Nagatsuma et al. | 324/244 |
| 4,584,470 | 4/1986 | Iizuka et al. | 324/96 |
| 4,612,500 | 9/1986 | Chen et al. | 324/96 |
| 4,613,811 | 9/1986 | Vaerewyck et al. | 324/96 |
| 4,631,402 | 12/1986 | Nagatsuma et al. | 250/231 R |
| 4,683,421 | 7/1987 | Miller et al. | 324/96 |
| 4,698,497 | 10/1987 | Miller et al. | 324/96 |
| 4,745,357 | 5/1988 | Miller | 324/96 |
| 4,755,665 | 7/1988 | Ulmer, Jr. et al. | 324/96 |

*Primary Examiner*—Reinhard J. Eisenzopf
*Assistant Examiner*—Vinh P. Nguyen
*Attorney, Agent, or Firm*—Antonelli, Terry, Stout & Kraus

[57] ABSTRACT

A sensor (1) for sensing the magnitude of current flowing in a conductor (12) based upon the Faraday effect. The sensor (10) includes a light source (14) for emitting a beam of light which is transmitted through the magneto-optic material (28) with one or more layers which causes a rotation of the plane of polarization of the light beam in proportion to the current flowing in the conductor (12). The beam of light with the rotated plane of polarization is split by a beam splitter (38) into two components which are then processed to produce an outputs (62, 63) indicative of the AC and DC components of the current flowing in the conductor. The outputs (62, 63) produced are independent of system losses.

21 Claims, 3 Drawing Sheets

CURRENT SENSOR AND METHOD UTILIZING MULTIPLE LAYERS OF THIN FILM MAGNETO-OPTIC MATERIAL AND SIGNAL PROCESSING TO MAKE THE OUTPUT INDEPENDENT OF SYSTEM LOSSES

CROSS REFERENCE TO RELATED APPLICATIONS

Reference is made to co-pending U.S. patent application Ser. No. 212,579, filed June 28, 1988, entitled "A Magneto-Optic Current/Magnetic Field Sensor" which is incorporated in its entirety herein by reference.

TECHNICAL FIELD

The present invention relates to current sensors which do not require connection of electrical circuitry to the circuit to measure current in the circuit. More specifically, the invention relates to current sensors of the aforementioned type utilizing the Faraday effect which are capable of producing an output indicative of the sensed current which is independent of system losses.

BACKGROUND ART

Numerous current measuring devices and magnetometers have been developed based upon the Faraday effect. The Faraday effect causes the plane of polarization of a polarized beam of light passing through a transparent substance exhibiting the Faraday effect to rotate from the plane of polarization of the incident light by an amount proportional to the magnetic field passing through the substance parallel to the optical axis of the beam of light.

U.S. Pat. Nos. 3,324,393, 3,419,802, 3,502,978, 3,581,202, 3,590,374, 3,597,683, 3,605,013, 3,693,082, 3,708,747, 3,746,983, 3,978,334, 3,980,949, 4,070,620, 4,070,622, 4,112,367, 4,232,264, 4,243,936, 4,255,018, 4,348,587, 4,363,061, 4,370,612, 4,428,017, 4,516,073, 4,529,875, 4,531,092, 4,539,519, 4,539,521, 4,540,937, 4,563,639, 4,563,646, 4,564,754, 4,578,639, 4,581,579, 4,584,470, 4,612,500, 4,613,811, 4,631,402, 4,683,421, 4,698,497, 4,745,357, and 4,755,665, disclose current or magnetic field sensors based upon the Faraday effect.

Magneto-optic materials exhibiting the Faraday effect have been developed and are commercially available which have a substrate of gadolinium gallium garnet which is coated with a layer of yttrium iron garnet.

In a current sensor or magnetometer based on the Faraday effect, transmission loss variations in the light path to and from the material exhibiting the Faraday effect can cause a sensor system to lose calibration. The transmission loss variations can result from, for example, demating and then remating optical connectors. In addition, variations in the light beam intensity can also cause such a sensor system to lose calibration.

Prior art Faraday effect devices have made numerous attempts to compensate for losses and/or variations in light intensity which would affect the measurements being attempted with the Faraday device. For example, see U.S. Pat. Nos. 4,540,937, 4,531,092, 4,539,521, 4,613,811, and 4,658,497 cited above which illustrate various prior art techniques for correcting or compensating for errors introduced into measurements being conducted with systems utilizing Faraday effect materials as a result of losses due to the optical transmission medium, variations in the light intensity, etc. However, none of these prior art devices attempt to eliminate the effects of optical transmission loss and light beam intensity variations in Faraday effect devices by utilizing a dual channel approach to the processing of signals representing the measured quantity of current flowing in a conductor where an AC/DC ratio calculation is conducted in each channel and the resulting ratios are mathematically combined to isolate the desired AC/DC components of the measured current. U.S. Pat. No. 4,755,665, cited above, discloses a system whereby two incident light beams are processed in separate channels to determine an average AC/DC ratio for each light beam and the resulting ratios are then provided to a divider circuit to compute a ratio of the first average value to the second average value.

A single channel processing approach has been disclosed in Kyuma et al, "Fiber Optic Measuring System For Electric Current by using a Magneto-Optic Sensor" IEEE Journal of Quantum Electronics, Vol. QE-18, No 10, (October, 1982), pp. 1619-1623. The Kyuma et al method is able to provide a single output indicative of AC current flowing in a conductor. The system of Kyuma et al cancels errors in the single output due to variations of the light source intensity, the transmission loss of fibers, the optical connector loss, or the insertion loss of the connector with the aid of a divider which normalizes an AC output with a DC output. However, the resulting single output in this approach is corrupted by a DC component in the measured field.

DISCLOSURE OF THE INVENTION

The present invention provides a current measuring device especially useful for applications where weight is a consideration such as air frames and further which does not require any electrical connections to the current conductor on which current measurement is to be made. Current sensing techniques used on air frames have utilized series resistors, current transformers, and Hall effect devices These devices have one or more of the following disadvantages: significant power dissipation; additional impedance in the circuit in the current carrying conductor; restricted band width; saturation; hysteresis; lack of voltage isolation; large size; large mass; and the necessity for breaking the conductor to insert the device.

The present invention provides an improved Faraday effect device which eliminates or minimizes these disadvantages and solves the aforementioned problems associated with prior art Faraday effect devices and provides improved processing techniques over the processing technique in Ser. No. 212,579. The Faraday effect device according to the present invention minimizes sensitivity of the device to both optical transmission loss variations and light beam intensity changes while permitting both AC and DC measurements to be made with the AC measurement not being influenced by a DC component in the current carrying conductor. Further, the current sensor of the present invention eliminates inaccuracies in the electrical signal, which is derived from the light beam which passes through the Faraday effect material, resulting from optical transmission loss variation and light beam intensity changes.

Furthermore, the present invention provides an improved magneto-optical current sensor which utilizes a processing circuit to process electrical signals derived from a light beam which passes through a Faraday effect material. The processing circuit eliminates errors due to losses attributable to the optical transmission of the light beam and light beam intensity variations and isolates the AC and DC components of the current flowing in the conductor. In addition to the AC and DC outputs provided by the processing circuit, the present invention includes a feedback mechanism which utilizes nulling. The nulling circuit utilizes the output representing the AC and DC components of the current flowing in the conductor and produces a current which is applied to a nulling coil which is magnetically coupled to the Faraday effect material to rotate the plane of polarization back to a zero reference position representative of no current flowing in the conductor. In addition to determining the magnetic field based upon the detected AC and DC components of the currents flowing in the conductor, the present invention alternatively can determine the strength of the magnetic field based upon the current produced by the nulling circuit.

A sensor for sensing the magnitude of current flowing in a conductor in accordance with the invention includes a light source for emitting a light beam to be transmitted through a magnetic field produced by the current which is to be measured; a magneto-optic material, responsive to the current flowing in the conductor, for rotating a plane of polarization of the light beam in proportion to the current flowing in the conductor and producing an output light beam with a rotated plane of polarization; the output light beam being split into two components; a circuit responsive to the two components, for producing a pair of outputs, one of the outputs being indicative of an AC component current flowing in the conductor and the other output being indicative of a DC component of the current flowing in the conductor; and a nulling circuit, responsive to the outputs indicative of the AC and DC components of the current flowing in the conductor, for producing a current which is applied to a coil magnetically coupled to the magneto-optic material to cause the plane of polarization of the light beam to be rotated by an amount equal to and in opposition to the rotation caused by the current flowing in the conductor. The magneto-optic material receives the light beam on an input side, the light beam passing through the material, and outputs the light on a discharge side, the magneto-optic material rotating the plane of polarization of the input beam in proportion to a magnetic field coupled in parallel to an optical axis of the beam passing through the material. The circuit responsive to the two components for producing the outputs indicative of the AC and DC components of the current flowing in the conductor includes a detector for detecting the two components of the split light beam and producing first and second electric signals indicative of the detected component; and a pair of channels, responsive to the first and second electrical signals, each channel processing one of the first and second electrical signals. The pair of channels eliminates from the received electrical signals the signal losses due to variations in the light source intensity and the optical transmission of the light beam and the light beam components, and each channel produces an output signal which is independent of the signal losses. The circuit responsive to the two components of the split light beam comprises a circuit which is responsive to the output signal independent of system losses associated with each of the pair of channels, for producing a signal indicative of the AC component of the current flowing in the conductor; and a circuit responsive to the output signal independent of system losses associated with each of the pair of channels, for producing a signal indicative of the DC component of the current flowing in the conductor. Each of the channels includes a filter for filtering low frequency components of the received electrical signals and producing a first filtered output signal and a filter for filtering high frequency components of the received signal and producing a second filtered output signal; a ratio calculator responsive to the first and second filtered output signals which calculates a ratio of the first and second filtered output signals and produces an output signal indicative of the calculated ratio. The invention further includes a circuit, responsive to the output of the ratio calculators, for calculating and producing a signal indicative of the AC component of the current flowing in the conductor; and a circuit responsive to the outputs of the ratio calculators for calculating and producing a signal indicative of the DC component of the current flowing in the conductor. The circuit for calculating and producing the signal indicative of the AC current flowing in the conductor performs the signal processing in accordance with the calculation:

$$(2 \cdot S_1 \cdot S_2)/(S_2 - S_1)$$

and the circuit for calculating and producing a signal which is indicative of the DC component of the current flowing in the conductor performs the signal processing in accordance with the calculation:

$$(S_2 + S_1)/(S_2 - S_1)$$

where $S_1$ and $S_2$ represent respective ratios of the first and second filtered output signals produced by each of the pair of channels.

A magneto-optical current sensor for measuring the magnitude of current flowing in a conductor includes a magneto-optic material, through which a plane polarized light beam is transmitted that is oriented in parallel with a component of a magnetic field produced by the current which causes a rotation of the plane of polarization of the light beam by an amount proportional to the current, the light beam with the rotated plane of polarization being split into two light beam components, and a processing circuit which is responsive to the two light beam components for producing a pair of outputs which are a function of the AC and DC components of the current flowing in the conductor, respectively, with the outputs produced by the processing circuit being independent of losses due to the light beam intensity and the optical transmission of the light beam and the light beam components. The processing circuit includes a pair of channels, each channel receiving and processing one of the two light beam components to provide a signal which is a function of the AC and DC components of the current flowing in the conductor. Each of the channels includes (i) a circuit, responsive to one of the light beam components, for providing an electrical signal proportional to the angle of rotation of the light beam in the magneto-optic material, and (ii) a circuit, responsive to the electrical signal, for eliminating an effect of losses in the electrical signal due to variations in light intensity and the optical transmission of the light beam and the light beam components, the circuit for eliminating providing a signal which is a function of the AC and DC components of the current flowing in the conductor; a calculation circuit, responsive to the signal produced by each channel which is a function of the AC and DC components of the current flowing in the conductor, for calculating and producing a signal which is proportional to the AC component of the current flowing in the conductor; and a calculation circuit, responsive to the signal produced by each channel which is a function of the AC and DC components of the current flowing in the conductor for calculating and producing a signal proportional to the DC component of the current flowing in the conductor.

A method for sensing current in accordance with the present invention includes the steps of transmitting a light beam through a magnetic field produced by the current which is to be measured; disposing a magneto-optic material in the optical path of the light beam to rotate a plane of polarization of the light beam in proportion to the current; splitting the light beam with the rotated plane of polarization into first and second components and producing first and second electrical signals respectively corresponding to the first and second components. The first electrical signal is processed by: filtering an AC component of the first electrical signal to produce a first filtered output signal; filtering a DC component of the first electrical signal to produce a second filtered output signal; and calculating a ratio $S_1$ of the first and second filtered output signals. The second electrical signal is processed by: filtering an AC component of the second electrical signal to produce a third filtered output signal; filtering a DC component of the second electrical signal to produce a fourth filtered output signal; and calculating a ratio $S_2$ of the third and fourth filtered output signals. An AC component of the current is then calculated in accordance with the calculation:

$$(2*S_1*S_2)/(S_2-S_1).$$

A DC component of the current is then calculated in accordance with the calculation:

$$(S_2+S_1)/(S_2-S_1).$$

BEST MODE FOR CARRYING OUT THE INVENTION

Figure 1:
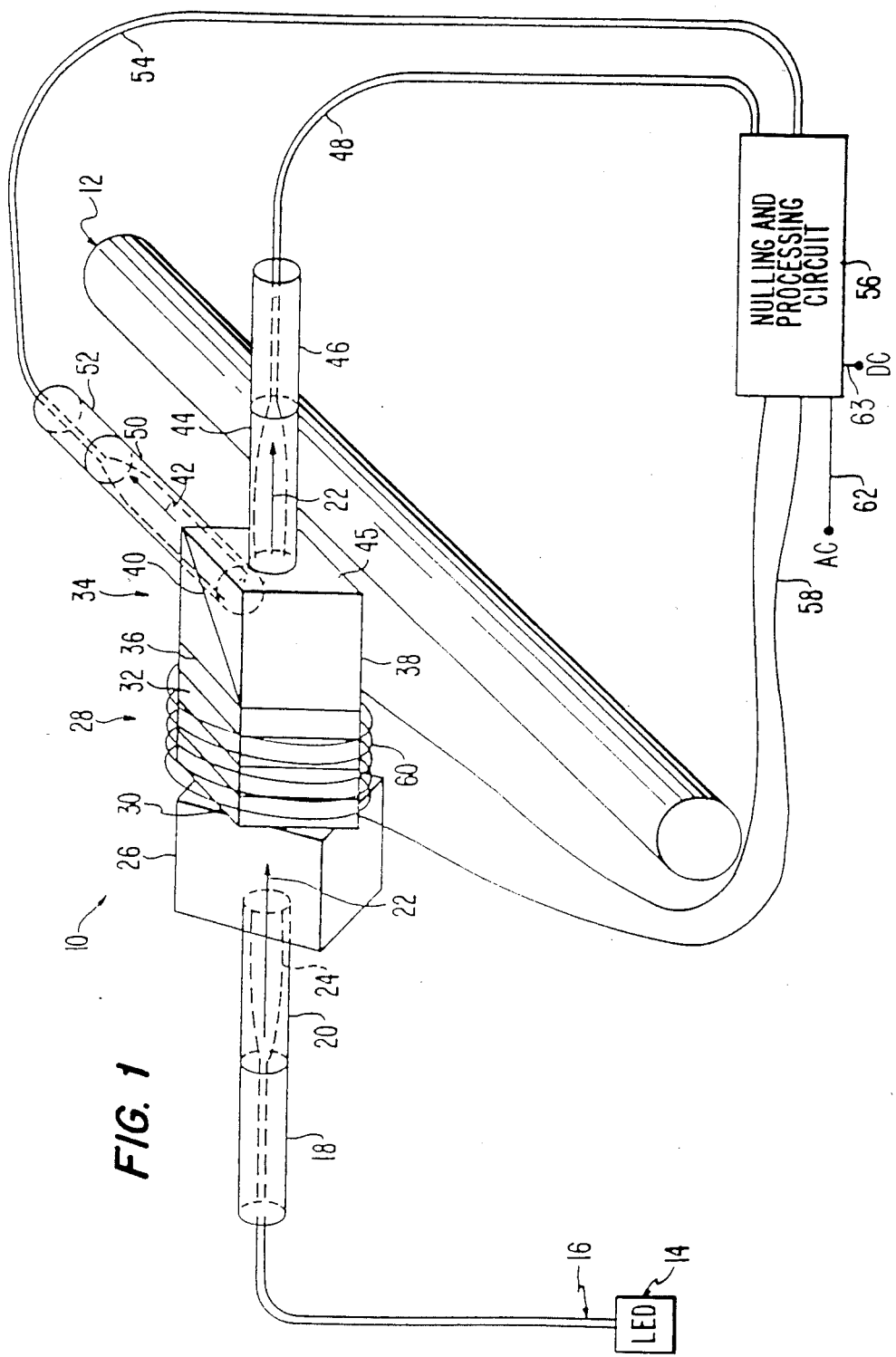
FIG. 1 illustrates an embodiment of the present invention.

FIG. 1 illustrates an embodiment 10 of the present invention which functions to measure the magnitude of current flowing in a conductor 12 utilizing the Faraday effect without electrical connection to the conductor. It should be understood that the present invention will measure AC and DC currents. The present invention is an improvement over the system disclosed in Ser. No. 212,579 in two aspects. First the present invention isolates AC and DC components of the current being measured. Second, the measured AC and DC components are free from system errors as discussed above and in more detail below The overall mode of operation is based upon the Faraday effect which causes a rotation of a plane of polarization of a beam of light passing through a material exhibiting the Faraday effect which is directly proportional to the magnitude of current flow in the conductor 12. A light emitting diode (LED) 14 is optically coupled to a conventional optical fiber 16 of the multimode type. The LED 14 may emit light at a wavelength of 1300 nm. The optical fiber 16 is connected to a ceramic ferrule 18 to which is attached a gradient index lens 20. The gradient index lens may be a 0.25 gradient index lens. The ceramic ferrule 18 and gradient index lens 20 function as a collimator to produce an output beam of collimated (substantially parallel) light traveling along an optical axis 22 which is indicated by an arrow within a cross-sectional area delineated by the dotted lines 24. The light beam intercepts a plane polarizer 26 which polarizes the beam of light exiting from the gradient index lens 20 into a first plane of polarization. The polarizer 26 maybe a conventional polarizing beam splitter.

A magneto-optic element 28 exhibiting the Faraday effect is optically coupled to the plane polarizer 26 to cause rotation of the plane of polarization of the beam exiting the plane polarizer 26, which enters the front face 30 of the magneto-optic element 28, by an amount proportional to the current flowing in the conductor 12. As is known, the plane of polarization of a plane polarized beam entering a magneto-optic element is rotated in direct proportion to the magnitude of the magnetic field coupled in parallel to the optical axis through the magneto-optic element. The orthogonal orientation of the conductor 12 ensures that the magnetic field will have components of lines of flux parallel to the optical axis 22 so that the plane of polarization of the light beam incident on the magneto-optic element 28 is rotated in direct proportion to the magnitude of the current flowing in the conductor 12.

It should be noted that the cross-sectional area 24 of the light beam exiting from the gradient index lens 20 is smaller than the surface area of the front face 30 of each of the layers 32 of the magneto-optic element 28 described below. This geometry insures that there is no alignment problem for attachment of either the gradient index lens 20 or the polarizer 26 to the front face 30 of the magneto-optic element 28. A conventional optical polarizing analyzing system 34 is attached to the rear face 36 of the magneto-optic element 28.

The polarizing analyzing system 34 includes an analyzing polarizing beam splitter 38 which divides the incident light traveling along the optical axis 22 into first and second beams. The plane of polarization of the polarizing beam splitter 38 is rotated 45° with respect to the plane of polarization of the plane polarizer 26 in order to provide more sensitivity in the polarizing analyzing system 34. The incident beam on the partially transmitting surface 40 is split into two components with the first component continuing along the optical axis 22 and the second component continuing on a new optical axis 42 which is orthogonal to the axis 22. In the absence of current flow in the conductor 12, the magneto-optic element 28 does not cause any rotation of the incident plane polarized light beam which results in components being outputted of equal magnitude from the polarizing analyzing system 34 along the optical axes 22 and 42.

A gradient index lens 44 is connected to the rear surface 45 of the polarizing beam splitter 38 which is attached to a ceramic ferrule 46. The ceramic ferrule 46 and gradient index lens 44 perform the opposite function as the ceramic ferrule 18 and a gradient index lens 20 in that they convert the light beam of crosssectional area 24 down to a size for coupling to a multimode optical fiber 48. Gradient index lens 50 and ceramic ferrule 52 perform the same function as the gradient index lens 44 and the ceramic ferrule 46 in coupling the light beam traveling along the optical axis 42 which has a cross-sectional area substantially identical to the cross-sectional 24, to a crosssectional area which permits coupling to a multimode optical fiber 54. The multimode optical fiber 48 and 54 are connected to a nulling and processing circuit 56.

The nulling and processing circuit 56 performs several functions. The first function is to sense the magnitude of the light beams traveling along the optical fibers 48 and 54 which is accomplished by photodetectors as described below with respect to FIG. 3. Second, a signal corresponding to each of the light beams traveling in the multimode optical fibers 48 and 54 is developed which is proportional to the angle of rotation of the plane of polarization of the light beam, caused by the flow of current in the conductor 12, in the magneto-optic element 28. These signals are then subjected to signal processing, as discussed below with reference to FIG. 3, to eliminate the effect of noise and losses due to variations in the LED intensity and the transmission of the light beam through the various optical transmission media. The resulting signals, which are a function only of the AC and DC components of the current flowing in the conductor 12, are then signal processed together to derive a signal representing the AC component of the current flowing in the conductor 12 and a signal representing the DC component of the current flowing in the conductor 12. These signals are outputted from the nulling and processing circuit 56 via lines 62 and 63. In addition, these signals are utilized to derive a current which is outputted on line 58 and applied to the coil 60 which contains a plurality of turns which encircle the magneto-optic element 28. The magnitude of the current on output line 58 produces a magnetic field equal to and opposing the magnetic field component parallel to the optical axis 22 produced by the flow of current in the conductor 12 to null the rotation of the plane of polarization of the output beam of light by the magneto-optic element 28 to the plane of polarization of the light beam incident on the magneto-optic element. The magnitude of the current flowing in the output line 58 is directly proportional to the magnitude of the current flowing in the conductor 12 and the magnitude of the magnetic field produced by the current flowing in the conductor 12.

The preferred form of the magneto-optic element 28 is as follows. One or more layers 32 are stacked together with their easy axes of magnetization parallel to the optical axis 22. Each of the layers has an optically transparent substrate having two opposed surfaces on which is grown a magneto-optic material which exhibits the Faraday effect. The coating of the Faraday effect material disposed on surfaces of each of the layers 32 may be, although not limited to, a thin film bismuth substituted yttrium iron garnet (YIG) and the substrate may be a large lattice constant (LLC) gadolinium gallium garnet (GGG). It should be understood that while the preferred material is gadolinium gallium garnet coated with yttrium iron garnet, other known material compositions available in layers having a substrate which is optically transparent to the wavelength of light emitted by the light emitting diode 14 and a surface coating exhibiting the Faraday effect may be used with the invention. Layers 32 having the aforementioned characteristics are known in the art and are commercially available from sources such as the Airtron division of Litton Industries in which a bismuth substituted yttrium iron garnet coating with a thickness of 45 microns is deposited on a large lattice constant substrate of gadolinium gallium garnet.

Figure 2:
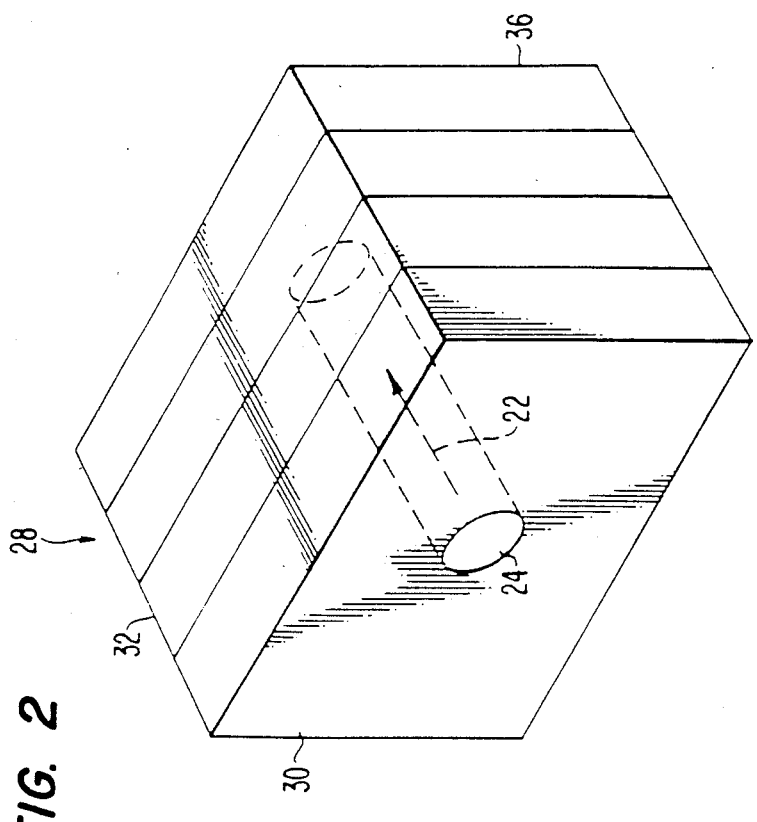
FIG. 2 illustrates an enlarged view of the Faraday effect material of FIG. 1.

FIG. 2 illustrates an enlargement of the magneto-optic element 28 illustrated in FIG. 1. It should be understood that one or more individual layers 32 of the aforementioned characteristics are attached together by a cement optically transparent to the wavelength of light emitted by the light emitting diode 14 to form a stack of layers. Each of the coatings of the Faraday effect material of the individual layers 32 exhibits an additive effect in rotating the plane of polarization of an incident plane polarized light beam. Accordingly, the angle of rotation of the plane of polarization produced by the magneto-optic material is directly proportional to the number of individual layers which are provided The limiting factor on the number of layers which may be utilized is the overall attenuation of the light beam passing through the magneto-optic material 28. The utilization of the relatively large number of layers 32 in combination with a relatively low power light emitting diode 14 can attenuate the output light beams from the analyzing polarizing beam splitter 38 to a degree which interferes with the overall operation of the nulling and processing circuit 56. A preferred orientation of the easy magnetic axis of each of the layers 32 is that they are each parallel to the optical axis 22.

Figure 3:
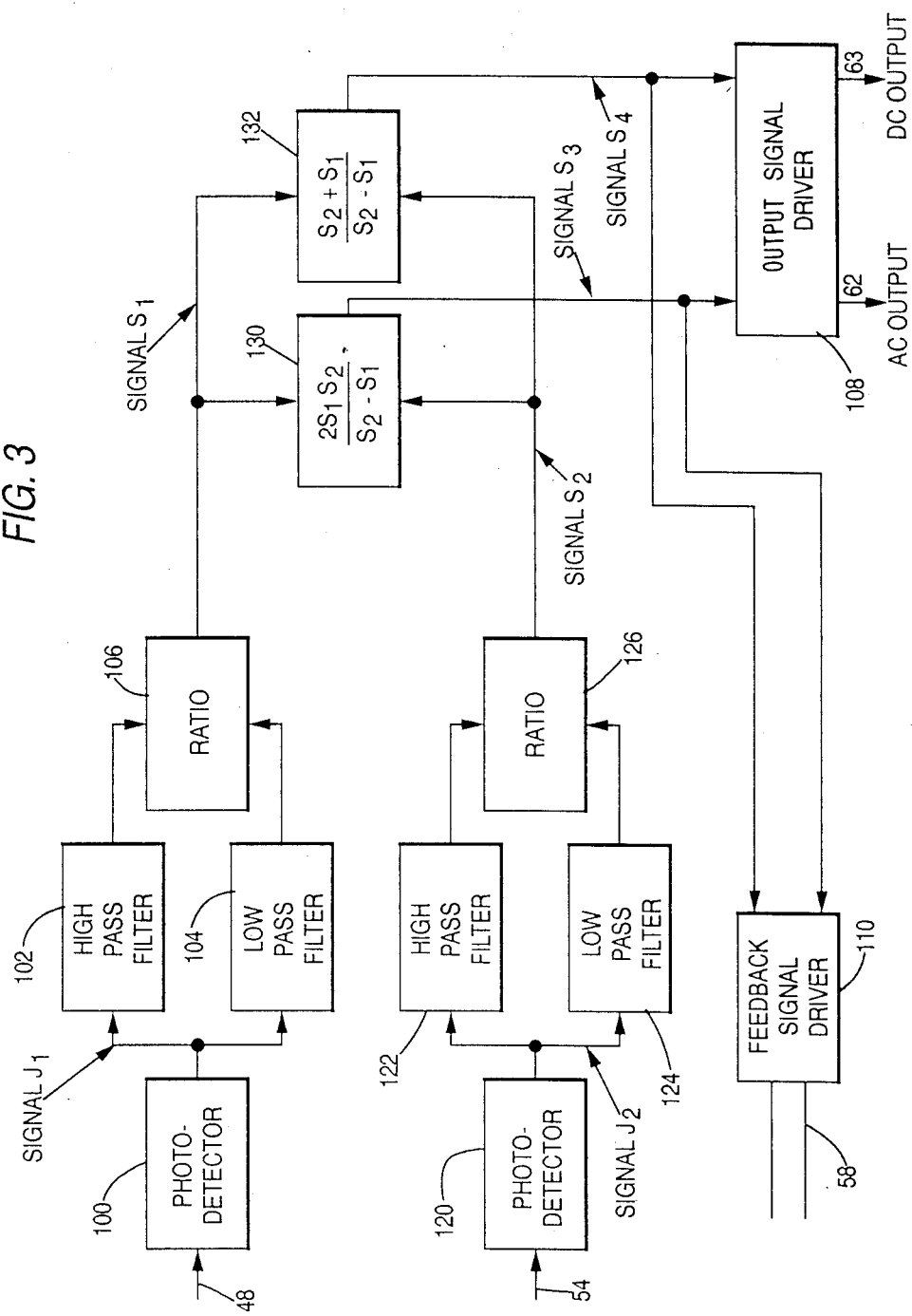
FIG. 3 illustrates the nulling and processing circuit of FIG. 1.

The nulling and processing circuit 56 shown in FIG. 1 is illustrated in more detail in FIG. 3. The nulling and processing circuit 56 shown in FIG. 3 is an improvement over that disclosed in co-pending application Ser. No. 212,579. The nulling and processing circuit disclosed in the co-pending application produces a single output equal to the magnitude of the sensed current. In addition to providing outputs indicative of both the AC and DC components of the current flowing in the conductor, the nulling and processing circuit 56 disclosed herein is insensitive to LED intensity variations and optical transmission losses. The current sensor disclosed in the co-pending application Ser. No. 212,579 previously incorporated by reference was insensitive to LED intensity variations and optical transmission losses only up to the analyzing polarizer 38.

As illustrated in FIG. 3, the light beams traveling along multimode optical fibers 48 and 54 are supplied to the nulling and processing circuit 56 which senses the magnitude of the light beams by the photodetectors 100 and 120 respectively The photodetector 100 is optically coupled to the multimode optical fiber 48. Similarly, the photodetector 120 is optically coupled to the multimode optical fiber 54. The photodetectors 100 and 120 produce electrical signals $J_1$ and $J_2$ respectively. The electrical signals $J_1$ and $J_2$ are proportional to the angle of rotation of the plane of polarization of the light beam in the magneto-optic material. The signals can be represented mathematically as follows:

$$J_1 = J_0 T_1 + J_0 T_1 \sin(V(\lambda) I(AC,DC) 1/\pi\rho) \tag{1}$$

$$J_2 = J_0 T_2 - J_0 T_2 \sin(V(\lambda) I(AC,DC) 1/\pi\rho) \tag{2}$$

where:
$J_0$ = transmitted intensity of the LED
$T_1$ and $T_2$ = transmission loss from LED to photodetector output
$V(\lambda)$ = Verdet constant as a function of wavelength I(AC,DC)=current in conductor with AC and DC components
l=length of magneto-optic material
ρ=distance from the center of the conductor to the point where the magnetic field is measured The signal J1 from the photodetector 100 is supplied to a high pass filter 102 and a low pass filter 104. The first and second terms on the right hand side of equation (1) are separated using the high pass filter 102 and the low pass filter 104 such that the low frequency loss term is passed by the low pass filter and attenuated by the high pass filter. In addition, the filters 102 and 104 respectively separate the AC and DC components of equation (1), respectively The signal J2 is subjected to the same filtering process through high pass filter 122 and low pass filter 124. The signals produced by the high pass filters 102 and 122 can be mathematically represented as follows:

$$J_{1HP} = J_0 T_1 \sin(V(\lambda)I(AC)l/\pi\rho) \qquad (3)$$

$$J_{2HP} = -J_0 T_2 \sin(V(\lambda)I(AC)l/\pi\rho) \qquad (4)$$

The signals which result from the low pass filtering process through low pass filters 104 and 124 can be mathematically represented as follows:

$$J_1 LP = J_0 T_1 + J_0 T_1 \sin(V(\lambda)I(DC)l/\pi\rho) \qquad (5)$$

$$J_2 LP = J_0 T_2 - J_0 T_2 \sin(V(\lambda)I(DC)l/\pi\rho) \qquad (6)$$

The high pass and low pass filters utilized are conventional filters. In the preferred embodiment it is desirable to have as low a cut off frequency for the low pass filter as possible. Typically, the low pass filter will operate in the range of 2 to 40 Hertz. It is also desirable to have the cut off frequency of the high pass filter pick up where the low pass filter cuts off, i.e., the cut off frequencies of the high pass and low pass filters should be approximately the same.

Once the J1 and J2 signals have been filtered as discussed above, it is necessary to eliminate the J0 and T terms (LED intensity and optical transmission loss). This is accomplished by normalizing the signals produced by the high pass filters 102 and 122 with the signals produced by the low pass filters 104 and 124, respectively, utilizing the ratio calculators 106 and 126. The ratio calculator 106 receives the signals $J_{1HP}$ and $J_{1LP}$ as inputs. Referring to equations (3) and (5) above, the ratio calculator 106 divides the signal represented by equation (3) with the signal represented by equation (5) and produces an output signal represented by:

$$S_1 = [\sin(V(\lambda)I(AC)l/\pi\rho)]/[1+\sin(V(\lambda)I(DC)l/\pi\rho)] \qquad (7)$$

The signal $S_1$ is no longer dependent upon the LED intensity or transmission loss terms $J_0$ and $T_1$, and is only dependent upon the AC and DC components of the current flowing in the conductor which is to be measured. A similar operation is performed in the ratio calculator 126 where the signal represented by equation (4) is divided with the signal represented by equation (6) and the resulting signal is represented by:

$$S_2 = [-\sin(V(\lambda)I(AC)l/\pi\rho)]/[1-\sin(V(\lambda)I(DC)l/\pi\rho)] \qquad (8)$$

The signal $S_2$ is also not dependent upon the LED intensity or transmission loss terms $J_0$ and $T_2$, and is only dependent upon the AC and DC components of the current flowing in the conductor which is to measured.

The use of the dual channel processing described above enables the current sensor of the present invention to be insensitive to LED intensity variations and transmission losses throughout the entire system. As discussed previously, this was not possible in the co-pending application Ser. No. 212 579.

The signals $S_1$ and $S_2$ are subjected to arithmetic signal processing as shown in arithmetic processors 130 and 132 in order to produce signals $S_3$ and $S_4$ which relate solely to the AC and DC components of the current flowing in the conductor 12, respectively As illustrated in FIG. 3, the signal $S_3$ is produced by arithmetic processor 130 which receives as inputs the signals $S_1$ and $S_2$ which are produced by the ratio calculators 106 and 126. The signals $S_1$ and $S_2$ are processed according to known signal processing methods to arrive at the signal $S_3$ in accordance with the following operation:

$$S_3 = (2*S_1*S_2)/(S_2 - S_1) \qquad (9)$$

which, when substituting equations (7) and (8) shown above, is reduced to:

$$S_3 = \sin(V(\lambda)I(AC)l/\pi\rho) \qquad (10)$$

which is solely a function of the AC current flowing in the conductor 12.

The signal $S_4$ is produced by arithmetic processor 132 which processes the signals $S_1$ and $S_2$ produced by the ratio calculators 106 and 126, respectively. Arithmetic processor 132 processes the signals $S_1$ and $S_2$ in accordance with the operation:

$$S_4 = (S_2 + S_1)/(S_2 - S_1) \qquad (11)$$

which is reduced, as shown above with equation (10), to:

$$S_4 = \sin(V(\lambda)I(DC)l/\pi\rho) \qquad (12)$$

which is solely a function of the DC component of the current flowing in the conductor 12.

The resulting signals $S_3$ and $S_4$ are then supplied to an output signal driver 108 which amplifies the signals in accordance with a desired gain, which may be an appropriate scaling factor. The resulting output signals 62 and 63 are a function of the AC and DC components of the current flowing in the conductor 12, respectively, independent of system losses.

In addition to being supplied to the output signal driver 108, the signals $S_3$ and $S_4$ are supplied to the nulling coil driver 110. The nulling coil driver 110 supplies a current to the nulling coil 60 which is derived from the signals $S_3$ and $S_4$. The current which is applied to the nulling coil 60 causes the plane of polarization of the light beam passing through the magneto-optic element 28 to be rotated equal to and in opposition to the rotation caused by the current flowing in the conductor 12. The operation of the nulling coil 60 is the same as that described in Ser. No. 212,579. In essence, the nulling coil driver 110 adjusts the current in the nulling coil 60 until the net rotation angle in the magneto-optic material 28 is zero. The magnetic field provided by the nulling coil 60 is then equal and opposite to the magnetic field produced by the current flowing in the conductor 12. The nulling coil driver 110 converts the voltage input to an appropriate current output which is supplied to the nulling coil.

While the disclosed embodiment of the invention is described as a current measuring device, it should be understood that the invention is applicable to measuring the magnitude of magnetic fields. The present invention measures magnetic fields in a manner identical to that described above with the exception that the outputs 62 and 63 are in units of magnetic field strength in accordance with constant and time varying components of the magnetic field.

While the invention has been described in the terms of a preferred embodiment, it should be understood that numerous modifications may be made thereto without departing from the spirit and scope of the appended claims. It is intended that all such modifications fall within the scope of the appended claims.

What is claimed is:

1. A magneto-optical current sensor for measuring the magnitude of current flowing in a conductor and producing an output indicative of an AC component and a DC component of the current, independent of system losses, comprising:
   (a) a light source for emitting a light beam to be transmitted through a magnetic field produced by the current which is to be measured;
   (b) a magneto-optical material, responsive to the current flowing in the conductor and disposed in an optical path of the light beam, for rotating a plane of polarization of the light beam in proportion to the current flowing in the conductor and producing an output light beam with a rotated plane of polarization;
   (c) means for splitting the output light beam into two components;
   (d) means for receiving the two components of the output light beam, producing a pair of outputs, one of the pair of outputs being indicative of the an AC component of the current flowing in the conductor and the other of the pair of outputs being indicative of the DC component of the current flowing in the conductor and for each of said two components computing a ratio of higher frequency to lower frequency portions for eliminating the system losses; and
   (e) means, responsive to the outputs indicative of the AC and DC components of the current flowing in the conductor, for producing a current which is to be applied to a coil magnetically coupled with the magneto-optic material, to rotate the plane of polarization of the light beam by an amount equal to and in opposition to the rotation caused by the current flowing in the conductor.

2. A sensor in accordance with claim 1 wherein the means for receiving the two components of the output light beam further comprises
   means for detecting the two components of the output light beam and producing first and second electrical signals indicative thereof; and
   a pair of channels for respectively receiving and processing the first and second electrical signals, each of the channels producing an output signal which is a function of the AC and DC components of the current flowing in the conductor independent of system losses.

3. A sensor in accordance with claim 2 wherein each channel comprises:

means, responsive to the electrical signal to be processed, for eliminating in the electrical signal losses due to variations in the light source intensity and the optical transmission of the light beam and the light beam components.

4. A sensor in accordance with claim 3 wherein the means for receiving the two components of the output light beam further comprises
   means, responsive to an output signal from the means for eliminating associated with each channel, for producing a signal indicative of the AC component of the current flowing in the conductor;
   means, responsive to the output signal from the means for eliminating associated with each channel, for producing a signal indicative of the DC component of the current flowing in the conductor.

5. A sensor in accordance with claim 3 wherein the means for eliminating associated with each channel comprises:
   means for filtering which passes low frequency components of the electrical signal to produce a first filtered output signal;
   means for filtering which passes high frequency components of the electrical signal to produce a second filtered output signal; and
   means, responsive to said first and second filtered output signals, for calculating a ratio of the first and second filtered output signals and producing an output signal indicative thereof 6. A sensor in accordance with claim 5 further comprising:
   means, responsive to the means for calculating a ratio associated with each channel, for producing a signal indicative of the AC component of the current flowing in the conductor; and
   means, responsive to the means for calculating a ratio associated with each channel, for producing a signal indicative of the DC component of the current flowing in the conductor 7. A sensor in accordance with claim 6 wherein:
   the means for producing a signal indicative of the AC component of the current flowing in the conductor determines the signal in accordance with the calculation:

$(2*S_1*S_2)/(S_2-S_1)$; and the means for producing a signal indicative of the DC component of the current flowing in the conductor determines the signal in accordance with the calculation:

$(S_2+S_1)/(S_2-S_1)$ and wherein $S_1$ represents the output signal of one means for calculating a ratio and $S_2$ represents the output signal of the other means for calculating a ratio.

8. In a magneto-optical current sensor for measuring the magnitude of current flowing in a conductor including a magneto-optic material, through which a plane polarized light beam is transmitted that is oriented in parallel with a component of a magnetic field produced by the current which causes rotation of the plane of polarization of the light beam by an amount proportional to the current, the light beam with the rotated plane of polarization being split into two light beam components, and a processing circuit, responsive to the two light beam components, for producing a pair of outputs which are a function of the AC and DC components of the current, respectively, wherein the pair of outputs produced by the processing circuit are independent of losses due to variations in the light beam intensity and the optical transmission of the light beam, the processing circuit comprising:
(a) a pair of channels each for receiving and processing one of the two light beam components to provide a signal which is a function of the AC and DC components of the current, wherein each of the pair of channels includes:
 (i) means, responsive to the received light beam component, for providing an electrical signal proportional to the angle of rotation in the magneto-optic material;
 (ii) means, responsive to the electrical signal, for eliminating the effect of losses in the electrical signal due to variations in light beam intensity and the optical transmission of the light beam and light beam components and providing a signal which is a function of the AC and DC components of the current;
(b) means, responsive to the signal provided by each channel which is a function of the AC and DC components of the current, for producing a signal which is a function of the AC component of the current; and
(c) means, responsive to the signal provided by each channel which is a function of the AC and DC components of the current, for producing a signal which is a function of the DC component of the current 9. A processing circuit in accordance with claim 8 wherein the means for eliminating comprises:
means for filtering a DC component of the electrical signal and producing a first filtered output signal;
means for filtering an AC component of the electrical signal and producing a second filtered output signal;
means, responsive to the first and second filtered output signals, for calculating a ratio of the first and second filtered output signals.

10. A processing circuit in accordance with claim 9 wherein the means for filtering a DC component and the means for filtering an AC component respectively comprise a high pass filter and a low pass filter 11. A processing circuit in accordance with claim 8 wherein the means for producing a signal which is a function of the AC component of the current determines the signal in accordance with the calculation:

$(2*S_1*S_2)/(S_2-S_1)$ and the means for producing a signal which is a function of the DC component of the current determines the signal in accordance with the calculation:

$(S_2+S_1)/(S_2-S_1)$ wherein $S_1$ represents a signal provided by one of the means for calculating a ratio and $S_2$ represents a signal provided by the other means for calculating a ratio 12. A processing circuit in accordance with claim 8 further comprising:
means, responsive to the signal which is a function of the AC component of the current and the signal which is a function of the DC component of the current, for producing a current which is to be applied to a coil coupled with the magneto-optic material to cause the plane of polarization of the light beam to be rotated an amount equal to and in opposition to the rotation caused by the current flowing in the conductor.

13. A magneto-optical current sensor for measuring the magnitude of current flowing in a conductor including a magneto-optic material, through which a plane polarized light beam is transmitted that is oriented in parallel with a component of a magnetic field produced by the current which causes rotation of the plane of polarization of the light beam by an amount proportional to the current, the light beam with the rotated plane of polarization being split into two light beam components, and a processing circuit, responsive to the two light beam components, for producing at least one output which is indicative of one of the AC and DC components of the current, wherein the at least one output is independent of losses due to variations in the light beam intensity and the optical transmission of the light beam and the light beam components, the processing circuit comprising
(a) a pair of channels, each channel for receiving and processing one of the two light beam components to produce a signal which is a function of the AC and DC components of the current, each channel including:
 (i) means, responsive to the received light beam component, for providing an electrical signal proportional to the angle of the rotation, of the plane of polarization of the light beam in the magneto-optic material; and
 (ii) means, responsive to the electrical signal, for eliminating the effect of losses in the electrical signal due to variations in the light beam intensity and the optical transmission of the light beam, and providing a signal which is a function of the AC and DC components of the current; and
(b) means, responsive to the signal provided by the eliminating means of each channel, for producing at least one signal which is a function of a single one of the AC and DC components of the current flowing in the conductor.

14. A magneto-optical current sensor in accordance with claim 13 wherein the means for eliminating comprises:
means for separating the electrical signal into a first signal and a second signal, the first signal being a function of the AC component of the current flowing in the conductor and the second signal being a function of the DC component of the current flowing in the conductor; and
means responsive to the first and second signals, for calculating a ratio of the first signal to the second signal.

15. A magneto-optical current sensor in accordance with claim 14 wherein the means for producing the at least one signal determines the at least one signal in accordance with at least one of the calculations:

$(2*S_1*S_2)/(S_2-S_1)$, and $(S_2+S_1)/(S_2-S_1)$ wherein $S_1$ and $S_2$ represent the signals produced by the means for eliminating associated with each channel.

16. A magneto-optical current sensor in accordance with claim 15 wherein the means for separating comprises:
   a high pass filter for receiving the electrical signal and producing the first signal; and
   a low pass filter for receiving the electrical signal and producing the second signal.

17. A magneto-optical current sensor in accordance with claim 16 wherein:
   a highest frequency signal which is capable of being passed by the low pass filter and a lowest frequency signal which is capable of being passed by the high pass filter are substantially equal.

18. A magneto-optical current sensor in accordance with claim 13 wherein the processing circuit further comprises:
   means, responsive to at least the one signal which is a function of a single one of the AC and DC components of the current, for providing a current which is to be applied to a coil coupled with the magneto-optic material to cause the plane of polarization of the light beam to be rotated an amount equal to and in opposition to the rotation caused by the current flowing in the conductor.

19. A magneto-optical magnetic field sensor for measuring a magnetic field and producing an output indicative of the magnitude of the magnetic field which is independent of system losses, the sensor comprising:
   (a) a light source for emitting a light beam to be transmitted through the magnetic field;
   (b) a magneto-optic material, responsive to the magnetic field to be measured and disposed in an optical path of the light beam, for rotating a plane of polarization of the light beam in proportion to the magnetic field and producing an output light beam with a rotated plane of polarization;
   (c) means for splitting the output light beam into two components;
   (d) means for receiving and processing the two components of the output light beam to eliminate the effects of losses due to variations in the light beam intensity and the optical transmission of the light beam and the two light beam components, the means for receiving and processing including:
      (i) means, responsive to the two light beam components, for providing first and second electrical signals which are proportional to the angle of rotation of the plane of polarization of the light beam in the magneto-optical material;
      (ii) means, responsive to the first and second electrical signals, for computing for each of said signals ratio of higher frequency to lower frequency signal portions, for eliminating the effect of losses in the electrical signals due to variations in the light beam intensity and the optical transmission of the light beam and the two light beam components;
   (e) means, responsive to an output signal from the means for eliminating, for producing an output signal proportional to the magnitude of the magnetic field.

20. A method for sensing current comprising the steps of:
   (a) transmitting a light beam through a magnetic field produced by the current which is to be measured;
   (b) disposing a magneto-optic material in the optical path of the light beam to rotate a plane of polarization of the light beam in proportion to the current;
   (c) splitting the light beam with the rotated plane of polarization into first and second components and producing first and second electrical signals respectively corresponding to the first and second components;
   (d) processing the first electrical signal by:
      (i) filtering an AC component of the first electrical signal to produce a first filtered output signal;
      (ii) filtering a DC component of the first electrical signal to produce a second filtered output signal;
      (iii) calculating a ratio $S_1$ of the first and second filtered output signals;
   (e) processing the second electrical signal by:
      (i) filtering an AC component of the second electrical signal to produce a third filtered output signal;
      (ii) filtering a DC component of the second electrical signal to produce a fourth filtered output signal;
      (iii) calculating a ratio $S_2$ of the third and fourth filtered output signals;
   (f) calculating an AC component of the current in accordance with the calculation:

$$(2*S_1*S_2)/(S_2 - S_1)$$

21. A method for sensing current comprising the steps of:
   (a) transmitting a light beam through a magnetic field produced by the current which is to be measured;
   (b) disposing a magneto-optic material in the optical path of the light beam to rotate a plane of polarization of the light beam in proportion to the current;
   (c) splitting the light beam with the rotated plane of polarization into first and second components and producing first and second electrical signals respectively corresponding to the first and second components;
   (d) processing the first electrical signal by:
      (i) filtering an AC component of the first electrical signal to produce a first filtered output signal;
      (ii) filtering a DC component of the first electrical signal to produce a second filtered output signal;
      (iii) calculating a ratio $S_1$ of the first and second filtered output signals;
   (e) processing the second electrical signal by:
      (i) filtering an AC component of the second electrical signal to produce a third filtered output signal;
      (ii) filtering a DC component of the second electrical signal to produce a fourth filtered output signal;
      (iii) calculating a ratio $S_2$ of the third and fourth filtered output signals;
   (f) calculating a DC component of the current in accordance with the calculation:

$$(S_2 + S_1)/(S_2 - S_1).$$

* * * * *